(12) United States Patent
Van Schaijk

(10) Patent No.: US 6,984,557 B2
(45) Date of Patent: Jan. 10, 2006

(54) METHOD OF MANUFACTURING A SEMICONDUCTOR DEVICE WITH NON-VOLATILE MEMORY COMPRISING A MEMORY CELL WITH AN ACCESS GATE AND WITH A CONTROL GATE AND A CHARGE STORAGE REGION

(75) Inventor: Robertus Theodorus Fransiscus Van Schaijk, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 91 days.

(21) Appl. No.: 10/485,482

(22) PCT Filed: Jun. 4, 2002

(86) PCT No.: PCT/IB02/02083

§ 371 (c)(1),
(2), (4) Date: Jan. 30, 2004

(87) PCT Pub. No.: WO03/015172

PCT Pub. Date: Feb. 20, 2003

(65) Prior Publication Data

US 2004/0235249 A1 Nov. 25, 2004

(30) Foreign Application Priority Data

| Aug. 6, 2001 | (EP) | ................................ | 01203000 |
| Aug. 6, 2001 | (EP) | ................................ | 01203001 |
| May 2, 2002 | (EP) | ................................ | 02076742 |

(51) Int. Cl.
*H01L 21/336* (2006.01)

(52) U.S. Cl. .................................................. 438/257

(58) Field of Classification Search ................ 438/197, 438/199, 211, 257, 264, 299, 301, 306
See application file for complete search history.

(56) References Cited

U.S. PATENT DOCUMENTS

| 6,642,103 B2 * | 11/2003 | Wils et al. ................... 438/257 |
| 2002/0137290 A1 * | 9/2002 | Wils et al. ................... 438/264 |
| 2004/0175886 A1 * | 9/2004 | Slotboom et al. ........... 438/257 |

* cited by examiner

*Primary Examiner*—Scott Geyer
(74) *Attorney, Agent, or Firm*—Peter Zawilski

(57) ABSTRACT

Consistent with an example embodiment, there is a method for manufacturing a semiconductor device. The semiconductor device comprises a semiconductor body provided at a surface with a non-volatile memory including a memory cell with a gate structure with an access gate and a gate structure with a control gate and a charge storage region situated between the control gate and the semiconductor body. In the method, on the surface of the semiconductor body a first one of said gate structures is formed with side walls extending substantially perpendicular to the surface, a conductive layer is deposited on and next to said first gate-structure, the conductive layer is subjected to a planarizing treatment until the first gate structure is exposed and the so planarized conductive layer is patterned so as to form at least a part of the other gate structure adjoining only a first one of the side walls of the first gate structure.

11 Claims, 13 Drawing Sheets

Figure 1:
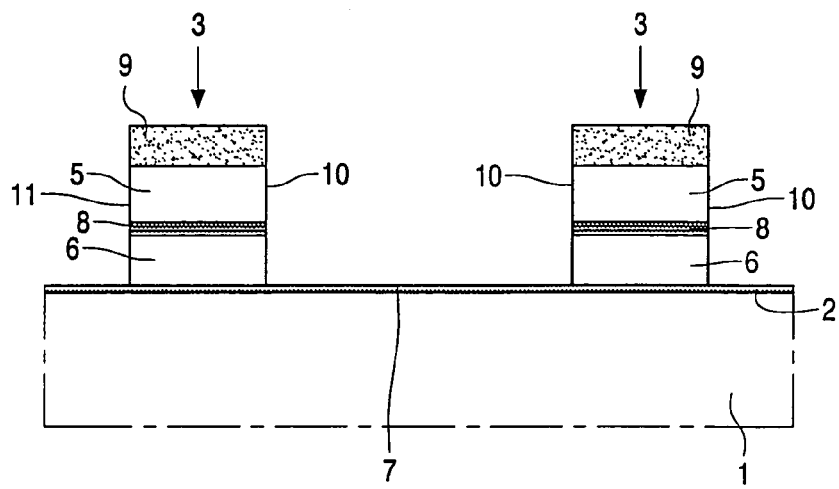

METHOD OF MANUFACTURING A SEMICONDUCTOR DEVICE WITH NON-VOLATILE MEMORY COMPRISING A MEMORY CELL WITH AN ACCESS GATE AND WITH A CONTROL GATE AND A CHARGE STORAGE REGION

The invention relates to a method of manufacturing a semiconductor device comprising a semiconductor body which is provided at a surface with a non-volatile memory comprising a memory cell with a gate structure with an access gate and a gate structure with a control gate and a charge storage region situated between the control gate and the semiconductor body, in which method on the surface of the semiconductor body a first one of said gate structures is formed with side walls extending substantially perpendicular to the surface, a conductive layer is deposited on and next to said first gate-structure, the conductive layer is subjected to a planarizing treatment until the first gate structure is exposed and the so planarized conductive layer is patterned so as to form at least a part of the other gate structure adjoining only a first one of the side walls of the first gate structure.

In practice the charge storage region can be a floating gate or a gate dielectric comprising a distribution of mutually separated trapping centers. Such a gate dielectric may, for example, be a silicon oxide layer with contaminations, for example metal particles, distributed therein, the contaminations thereby providing the trapping centers. However, a more widespread way is the use of a gate dielectric comprising a double layer of two different materials, which form a border layer supplying the mutually separated trapping centers. Using the above mentioned method both gate structures adjoin each other, so that small sized memory cells can be made. In practice a non-volatile memory of course will comprise a very large number of these memory cells.

From WO 01/67517 A1 a method as mentioned before is known, in which method the planarized conductive layer is patterned by anisotropic etching, after a photo resist mask has been formed on the first gate structure and on the planarized conductive layer next to said first one of the side walls of the first gate structure.

The use of this photo resist mask will influence the size of the memory cell. The photo resist mask can not be placed exactly in a desired position, but overlay errors should be considered. This will lead to a relatively large photo resist mask and thus to a relatively large memory cell.

The invention has for its object to provide a method which offers the possibility of manufacturing very small memory cells.

According to the invention the method mentioned in the opening paragraph is therefore characterized in that to perform said patterning of the planarized conductive layer, an etch mask is formed on the first gate structure and the planarized conductive layer which etch mask leaves the planarized conductive layer next to said first side wall uncovered and covers the planarized conductive layer next to the side wall opposite to the first side wall, after which the planarized conductive layer is etched back so as to expose an upper portion of said first side wall, the etch mask is removed, a spacer is formed on the exposed upper portion of said first side wall and the conductive layer is etched anisotropically using the spacer as a mask, whereby the conductive layer next to the spacer and next to the side wall of the first gate structure opposite to said first side wall is removed.

The etch mask used in the method according to the invention which leaves the planarized conductive layer next to said first side wall uncovered and covers the planarized conductive layer next to the side wall opposite to the first side wall protects the planarized conductive layer next to the side wall opposite to said first side wall. Because the etch mask also may cover at least a part of the top of the first gate structure the etch mask can be put in place relatively easily. In practice the width of the top of the first gate structure is much larger than overlay errors which have to be considered.

The spacer on the exposed upper portion of said first side wall can be made at minimum costs, without using a photo resist mask, in a self aligned manner. Such spacers on vertical walls are formed in practice by depositing an auxiliary layer and then etching said auxiliary layer anisotropically until only spacers are left on the vertical walls. The width of the spacers then equals about the thickness of the auxiliary layer. Because the spacer thus can be made with a very small width and because overlay errors have not to be considered, very small memory cells can be realized.

A first preferred embodiment of the method according to the invention is characterized in that as the first one of said gate structures the gate structure with the control gate and the charge storage region situated between the control gate and the semiconductor body is formed, the side walls of this gate structure are covered by an insulating layer and the surface of the semiconductor body next to the gate structure is provided with a gate dielectric, after which the conductive layer is deposited and planarized, the etch mask is formed, the planarized conductive layer is etched back, the spacer is formed on the exposed portion of said first side wall of the first gate structure and the etched back conductive layer is etched using the spacer as a mask so as to form the gate structure with the access gate adjoining said first side wall. As said before the charge storage region can be a floating gate or a gate dielectric comprising a distribution of mutually separated trapping centers. This gate structure with control gate and charge storage region can be etched anisotropically in a stack of layers formed on the surface of the semiconductor body. Then automatically said side walls perpendicular to the surface of the semiconductor are formed. These side walls can be covered easily by an insulating layer by depositing a layer followed by an anisotropic etch until the top of the gate structure is exposed or also by an oxidation treatment, when, what is usual in practice, the gates in the gate structure are formed in layers of polycrystalline silicon. On top of the stack of said layers an extra layer may be deposited which may act as a protection layer during forming the insulating layer on the side walls and also as a stop layer during the planarizing treatment.

A second preferred embodiment of the method according to the invention is characterized in that as the first one of said gate structures the gate structure with the access gate is formed, after which the side walls of this gate structure are covered by an insulating layer, the conductive layer is deposited and planarized, the etch mask is formed, the planarized conductive layer is etched back, the spacer is formed on the exposed portion of said first side wall of the first gate structure and the etched back conductive layer is etched using the spacer as a mask so as to form the control gate of the gate structure with the control gate and the charge storage region situated between the control gate and the semiconductor body. This embodiment of the method offers, as will be demonstrated later with reference to the drawing, the opportunity of realizing a lot of gate structures with control gate and charge storage region, without using further photo resist masks.

Figure 8:
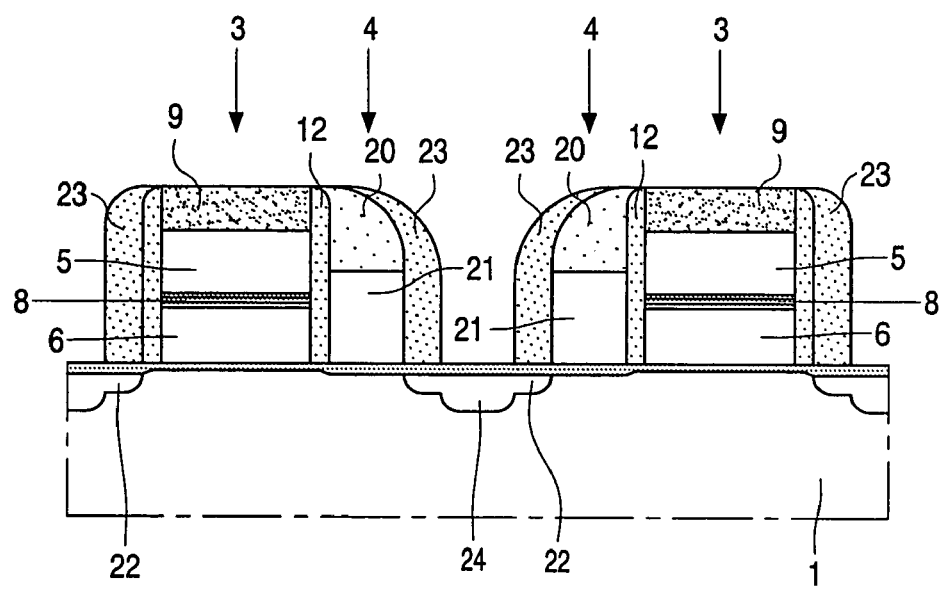
Figure 9:
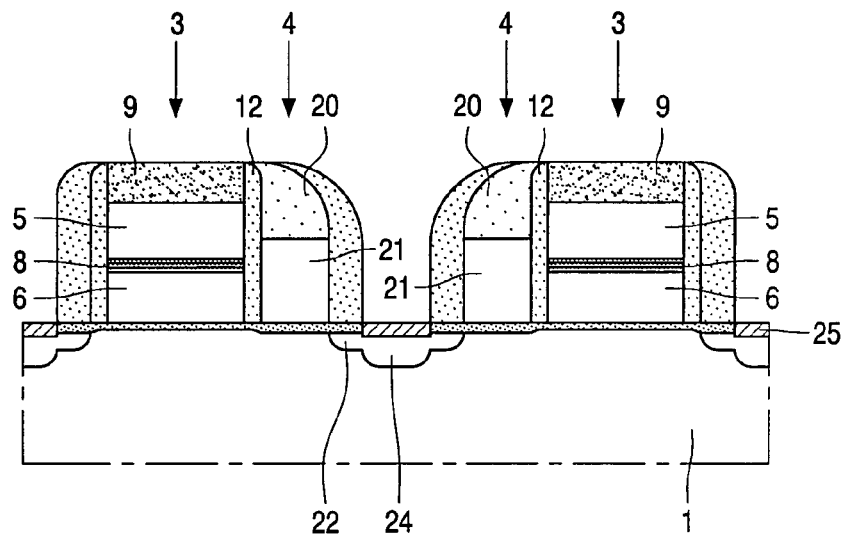
Figure 10:
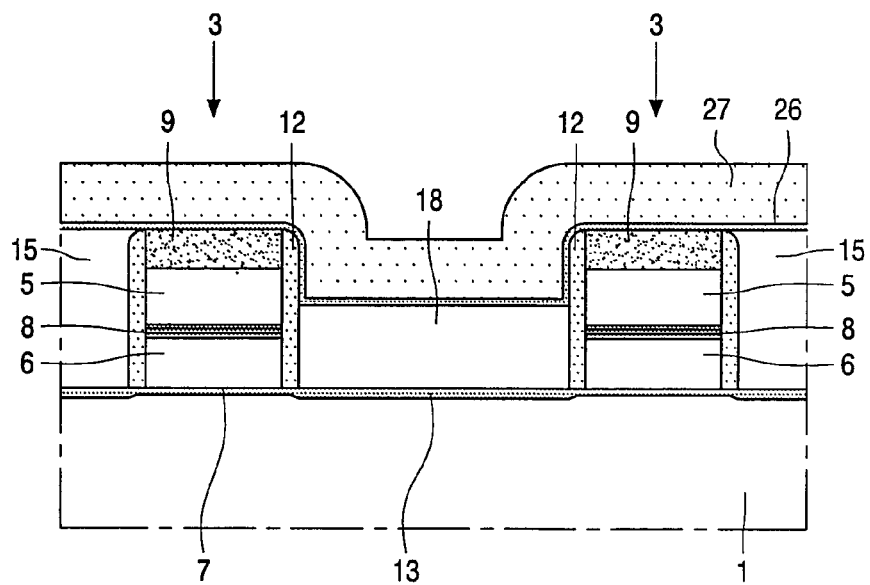
Figure 11:
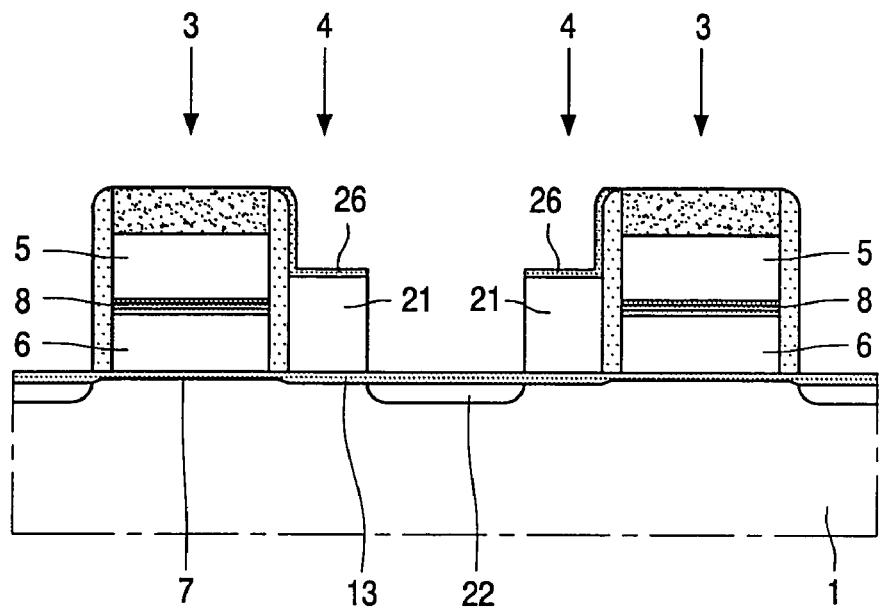
Figure 12:
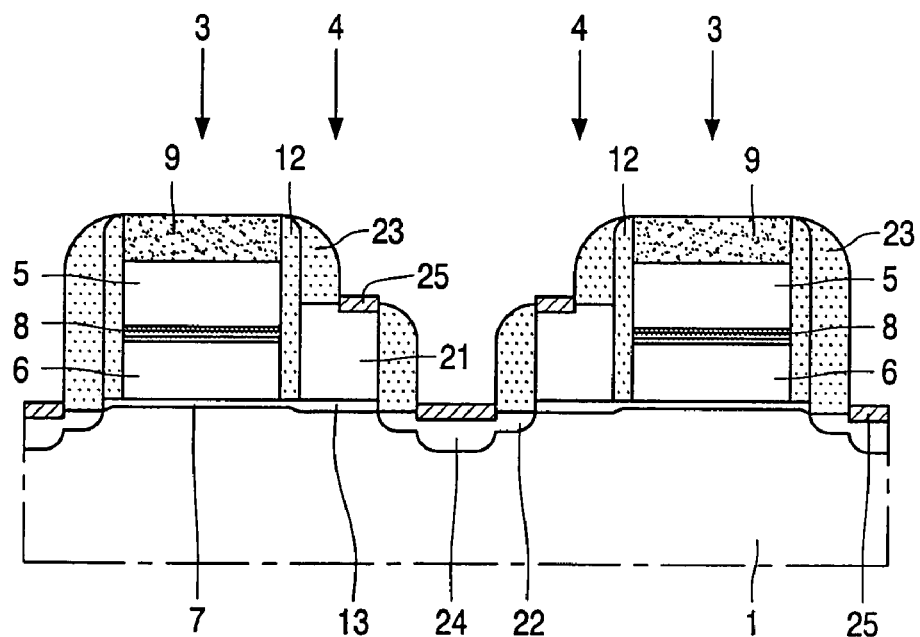
Figure 13:
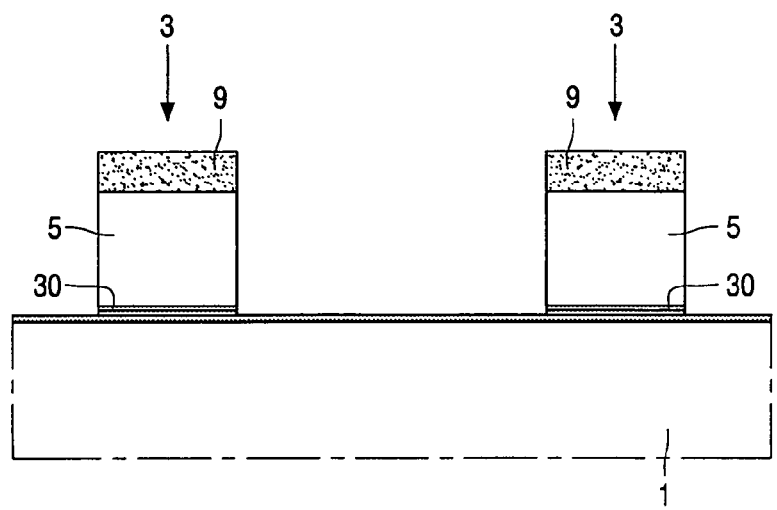
Figure 14:
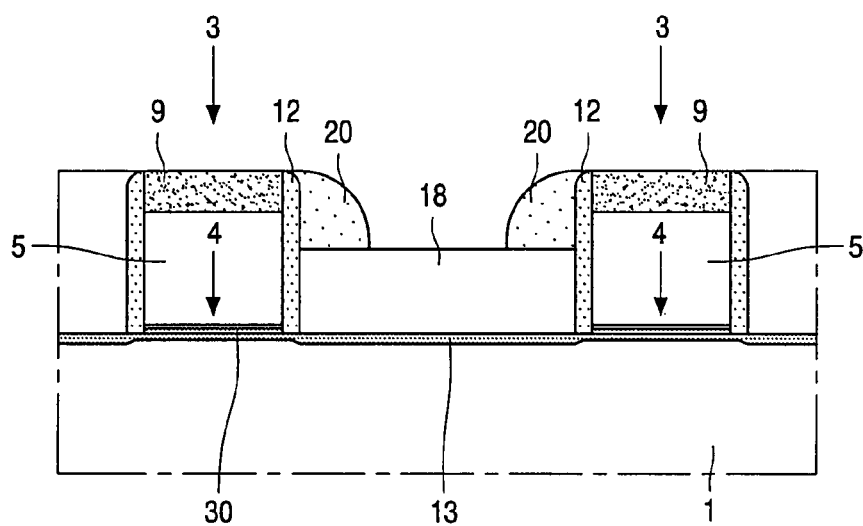
Figure 15:
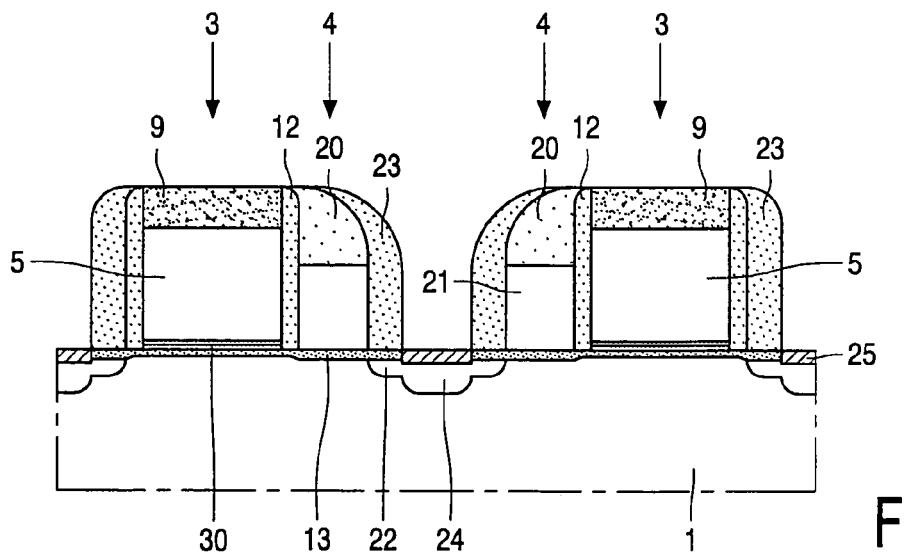
Figure 16:
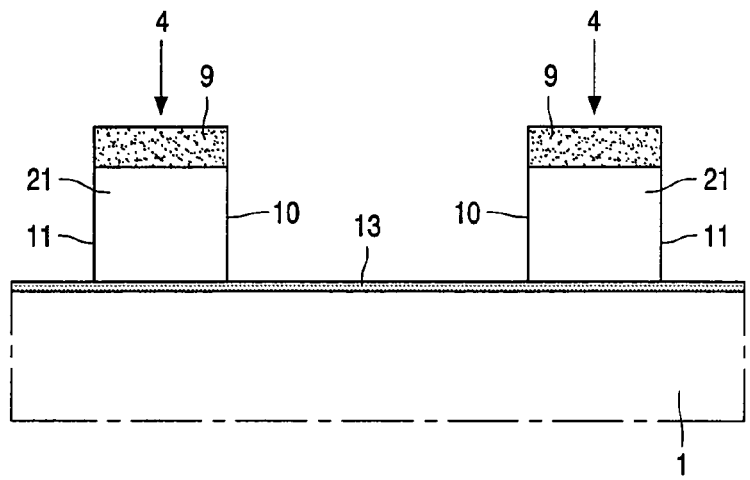

These and other aspects of the invention will be apparent from and be elucidated with reference to the embodiments described hereinafter and shown in the drawing. In the drawing:

FIGS. 1 to 9 show a diagrammatic cross-sectional views of successive stages in the manufacture of a non volatile memory cell using a first embodiment of the method according to the invention, FIGS. 10 to 12 show a diagrammatic cross-sectional views of successive stages in the manufacture of a non volatile memory cell using a second embodiment of the method according to the invention, FIGS. 13 to 15 show a diagrammatic cross-sectional views of successive stages in the manufacture of a non volatile memory cell using a third embodiment of the method according to the invention, FIGS. 16 to 21 show a diagrammatic cross-sectional views of successive stages in the manufacture of a non volatile memory cell using a fourth embodiment of the method according to the invention, FIGS. 22 to 27 show a diagrammatic cross-sectional views of successive stages in the manufacture of a non volatile memory cell using a fifth embodiment of the method according to the invention and FIGS. 28 to 33 show a diagrammatic cross-sectional views of successive stages in the manufacture of a non volatile memory cell using a sixth embodiment of the method according to the invention.

FIGS. 1 to 9 show in diagrammatic cross-sectional views successive stages of manufacturing a semiconductor device with a non-volatile memory comprising a memory cell with a gate structure 4 with an access gate 21 and a gate structure 3 with a control gate 5 and a charge storage region 6 situated between the control gate and a semiconductor body 1. For the sake of clarity the manufacture of only two neighboring cells is described, but it will be clear, that in practice a non volatile memory comprises much more of these memory cells.

As shown in FIG. 1 on a surface 2 of the semiconductor body 1, here a p-type doped silicon body, a first one of the gate structures, in this example the gate structure 3 with the control gate 5 and the charge storage region situated between the control gate and the semiconductor body are formed. In this example the charge storage region is a floating gate 6. The gate structure 3 here comprises a tunnel dielectric 7, a floating gate 6, an inter gate dielectric 8 and a top layer 9. The gate structure is formed by an anisotropic etch of a stack of layers. The tunnel dielectric 7 may be formed in a 7–10 nm thick layer of silicon oxide, the floating gate 6 in an about 200 nm thick layer of polycrystalline silicon, the inter gate dielectric 8 in an about 18 nm thick layer of ONO (a 6 nm thick layer of silicon oxide, a 6 nm thick layer of silicon nitride and a 6 nm thick layer of silicon oxide), the control gate 5 in an about 200 nm thick layer of polycrystalline silicon and the top layer 9 in an about 100 nm thick layer of silicon nitride. Because the gate structure 3 is formed by an anisotropic etch the structure has side walls 10 and 11 extending substantially perpendicular to the surface 2 of the semiconductor body 1.

Figure 2:
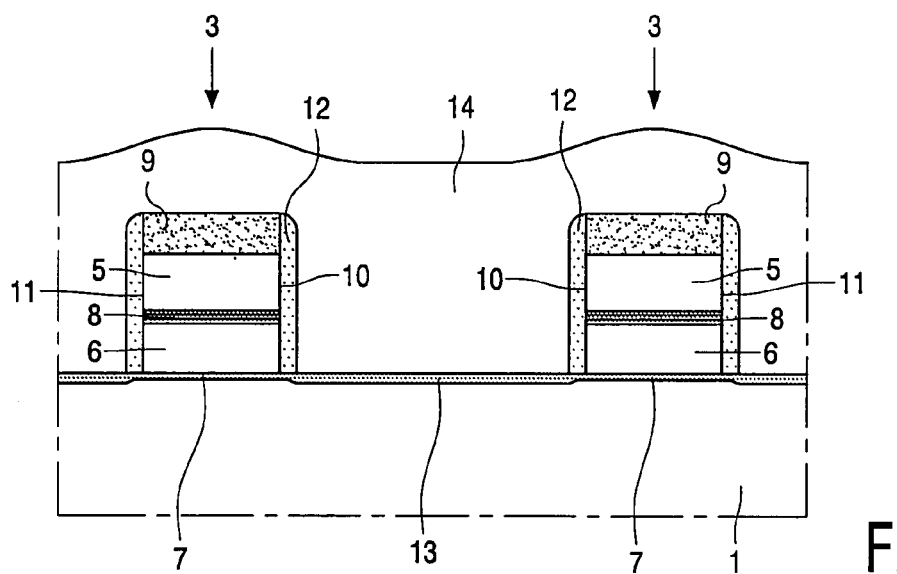

As shown in FIG. 2 the side walls 10 and 11 are covered by an about 30 nm thick insulating layer 12, here a layer of silicon oxide and the surface next to the gate structure 3 is covered with a gate dielectric 13, here an about 6 nm thick layer of silicon oxide. The insulating layer 12 may be formed by thermal oxidation of the gate structure or by depositing a layer followed by an anisotropic etch which is stopped as soon as the top layer 9 is exposed.

Figure 3:
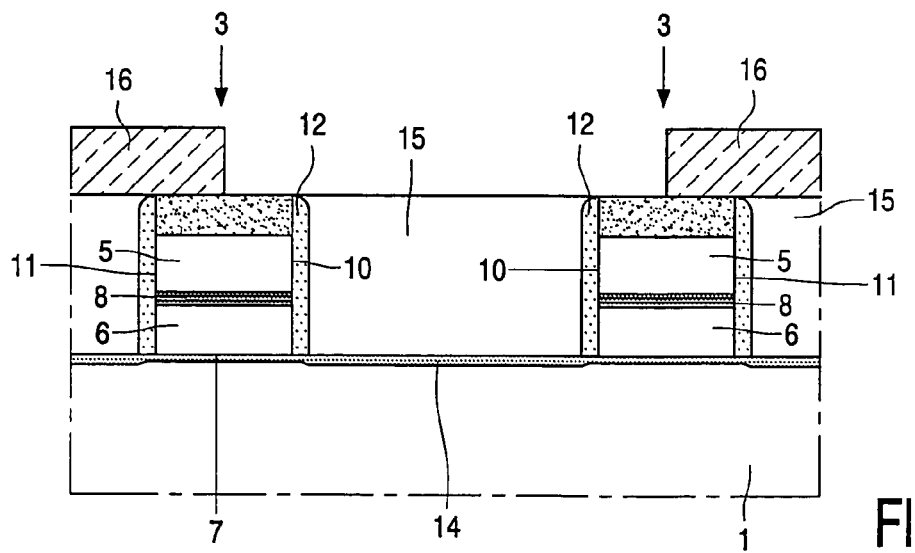

After the gate structure 3 is formed and its side walls 10 and 11 are covered with the insulating layer 12, a relatively thick conductive layer 14, here an about 500 nm thick layer of polycrystalline silicon is deposited on and next to said first gate-structure 3. As shown in FIG. 3 the conductive layer 14 then is subjected to a planarizing treatment until the top layer 9 of the first gate structure 3 is exposed. The so planarized conductive layer 15 then is patterned so as to form at least a part of the other gate structure 4 adjoining the first gate structure 3.

Figure 4:
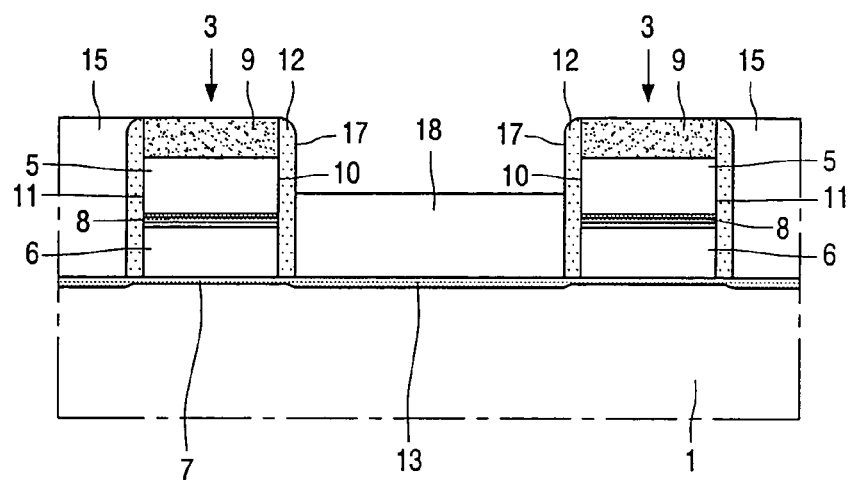
Figure 5:
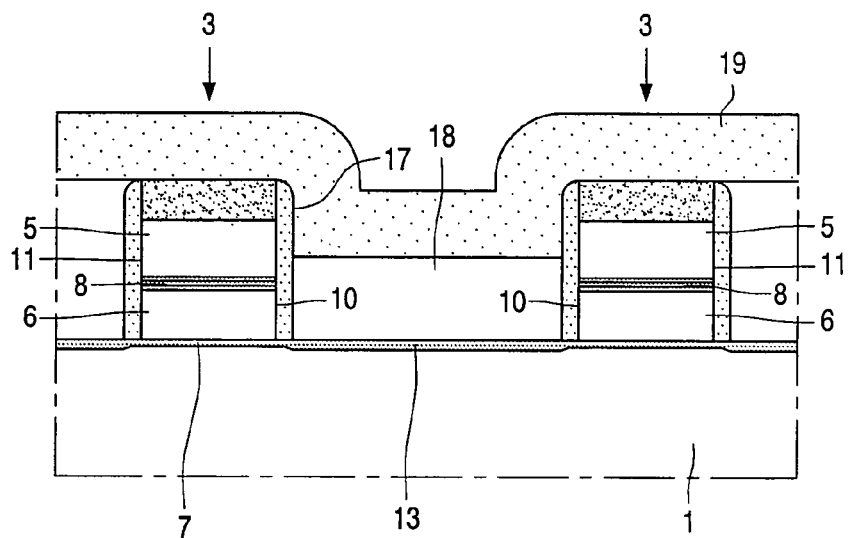
Figure 6:
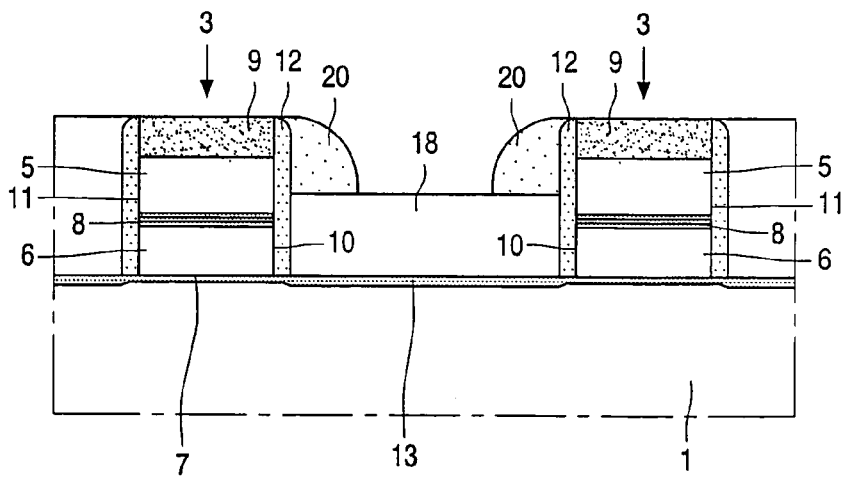

The patterning of the planarized conductive layer 15 is performed as shown in the FIGS. 4, 5, 6 and 7. In a first step, as shown in FIG. 4 an etch mask 16 is formed on the first gate structure 3 and the planarized conductive layer 15. The etch mask 16 leaves the planarized conductive layer 15 next to the first side walls 10 uncovered and covers the planarized conductive 15 layer next to the side walls 11 opposite to the first side walls 10. The etch mask 16 protects the planarized conductive layer 15 next to the side walls 11 opposite to said first side walls 10. Because the etch mask 16 also may cover at least a part of the top layer 9 of the first gate structure 3 the etch mask 16 can be put in place relatively easily. In practice the width of the top layer 9 of the first gate structure 3 is much larger than overlay errors which have to be considered.

Figure 7:
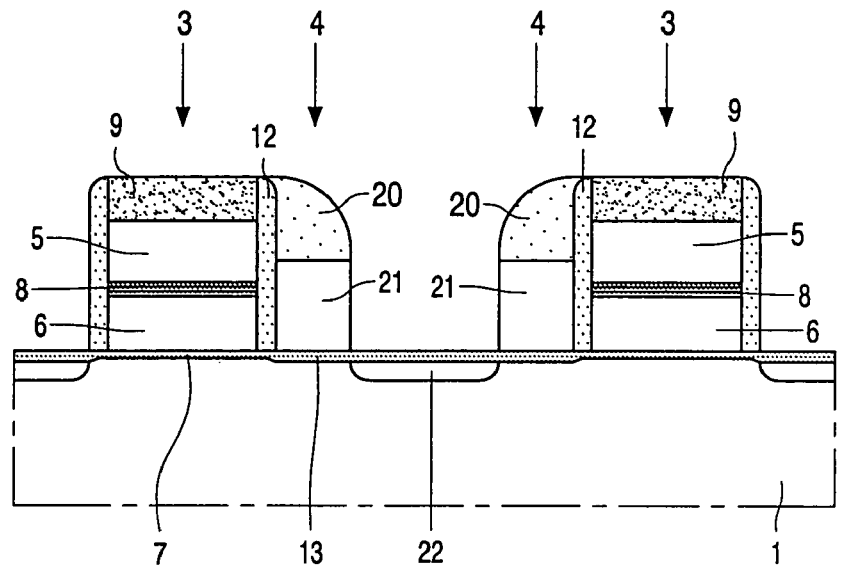

In the next step the planarized conductive layer 15 is etched back so as to expose an upper portion 17 of the first side walls 10. This etching back can be carried out by means of an isotropic etch or anisotropic etch or as a combination of an isotropic etch and an anisotropic etch. From the conductive layer 14 then a part 18 remains between the two gate structures 3 shown in FIG. 4. Next to the other side walls 11 the planarized conductive layer 15 remains unaffected. Then spacers 20 are formed on the exposed upper portions 17 of the first side walls 10 of first gate structures 3. The spacers 20 are formed in a usual manner by depositing a layer 19, here a layer of silicon oxide, followed by an anisotropic etch until the top layer 9 of the first gate structure 3 is exposed. As shown in FIG. 7, then the remaining part of the conductive layer 18 is etched anisotropically using the spacers 20 as a mask whereby the conductive layer 15 next to the opposite side walls 11 is removed. Thus the second gate structures 4, here consisting of a gate dielectric 13 and an access gate 21, only next to the first side walls 10 of the first gate structures 3 are formed.

Then as shown in the FIG. 8 in a usual manner lightly doped source- and drain zones 22 are formed by ion implantation. Then as shown in FIG. 8 further spacers 23 are formed and highly doped source- and drain zones 24 are formed. As shown in FIG. 9 the source- and drain zones the may be provided with a top layer 25 of a silicide.

The spacers 20 on the exposed upper portions 17 of the first side walls 10 of the first gate structures 3 can be made at minimum costs, without using a photo resist mask, in a self aligned manner. Because the spacers 20 can be made with a very small width very small memory cells can be realized.

In the FIGS. 1 to 9 a first embodiment of the method has been shown whereby the first one of said gate structures 3 is the gate structure with the control gate 5 and the charge storage region 6 situated between the control gate and the semiconductor body is formed, the side walls 10,11 of this gate structure are covered by an insulating layer 12 and the surface of the semiconductor body 1 next to the gate structure 3 is provided with a gate dielectric 13. Then the conductive layer 14 is deposited and planarized, the etch mask 16 is formed, the planarized conductive layer is etched back, the spacer 20 is formed on the exposed portion 17 of said first side wall 10 of the first gate structure 3 and the etched back conductive layer 18 is etched using the spacer 20 as a mask so as to form the gate structure 4 with the access gate 21 adjoining said first side wall 10.

In the examples that follow, as far as possible, for corresponding parts of the memory cells the same reference numbers are used as in the manufacture of the memory cell described before.

FIGS. 10 to 12 show in diagrammatic cross-sectional views successive stages of manufacturing a semiconductor device with a non-volatile memory comprising a memory cell as in the preceding example with a gate structure 4 with an access gate 21 and a gate structure 3 with a control gate 5 and a charge storage region 6 situated between the control gate and the semiconductor body, whereby the spacer 20 is formed in a different way.

As shown in FIG. 10, a stage of manufacturing comparable with that shown in FIG. 4, first a relatively thin auxiliary insulating layer 26 is deposited, here an about 10 nm thick layer of silicon oxide, and then a further layer 27, in this example a layer of polycrystalline silicon, the same material as the conductive layer 14. Then the layer 27 is etched anisotropically until the layer 26 on top of the gate structure 3 is exposed and then the layer 26 is etched until the top layer 9 is exposed. When, as shown in FIG. 11 the remaining part 18 of the conductive layer is etched also the layer 27 of the spacer is also removed, only its part formed in layer 26 remains. When this remaining part of the insulating layer 26 is removed the so formed access gate 21 has an exposed top surface.

When as shown in FIG. 12 the spacer 23 is formed a part of the access gate 21 remains exposed. When the silicide regions 25 are formed on the source- and drain regions of the memory cells in the same process step silicide regions 25 are formed on the access gate 21. Said gate thus gets a relatively low electrical resistance.

FIGS. 13 to 15 show a diagrammatic cross-sectional views of successive stages in the manufacture of a non volatile memory cell using a third embodiment of the method according to the invention. As shown in FIG. 13 the charge storage region here is formed by a stack 30 of insulating layers provided with trapping centers, here an about 6 nm thick layer of silicon oxide formed on an about 6 nm thick layer of silicon nitride formed on an about 6 nm thick layer of tunnel oxide formed on the surface 2 of the semiconductor body. On this stack the control gate 5 and the top layer 9 are formed. The side walls 10 and 11 are provided with the insulating layer 12 and the surface next to the gate-structure 3 with the layer gate oxide 13.

Then the conductive layer 14 is deposited and planarized. Then the etch mask 16 is formed, the planarized conductive layer 15 is etched back, the spacers 20 are formed on the exposed portions 17 of said first side walls 10 of the first gate structures 3 and the etched back conductive layer is etched using the spacers 20 as a mask so as to form the gate structures 4 with the access gates 21 adjoining said first side walls 10.

FIGS. 16 to 21 show in diagrammatic cross-sectional views successive stages of manufacturing a memory cell with a gate structure 4 with an access gate 21 and a gate structure 3 with a control gate 5 and a charge storage region 6 situated between the control gate and the semiconductor body using a fourth embodiment of the method according to the invention. In this example as the first one of said gate structures the gate structure 4 with the access gate 21 is formed. Here the about 400 nm thick access gate 21 of polycrystalline silicon is formed on an about 6 nm thick layer of gate oxide 13 and covered by the top layer 9 of silicon nitride.

Figure 17:
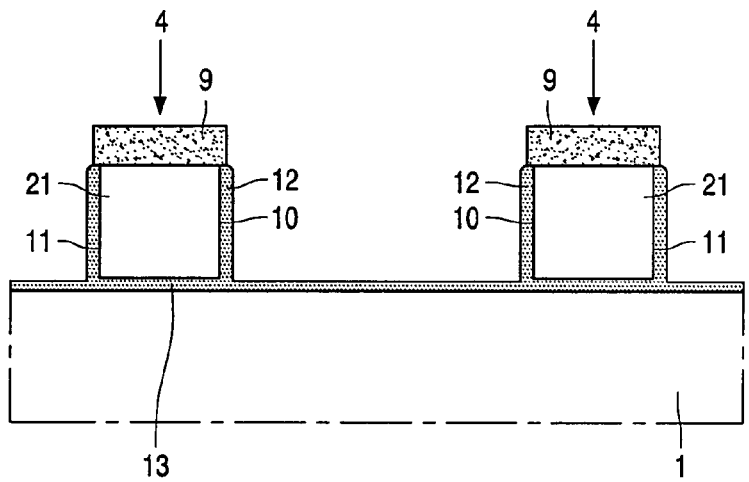
Figure 18:
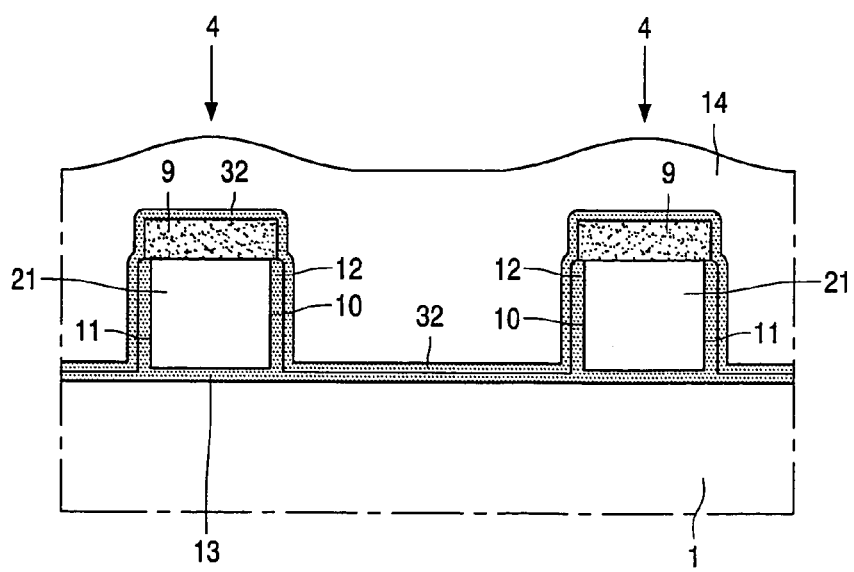
Figure 19:
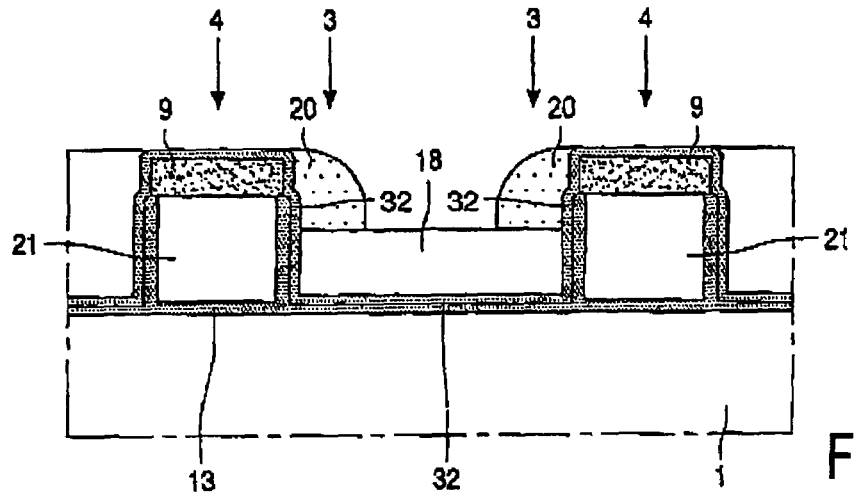
Figure 20:
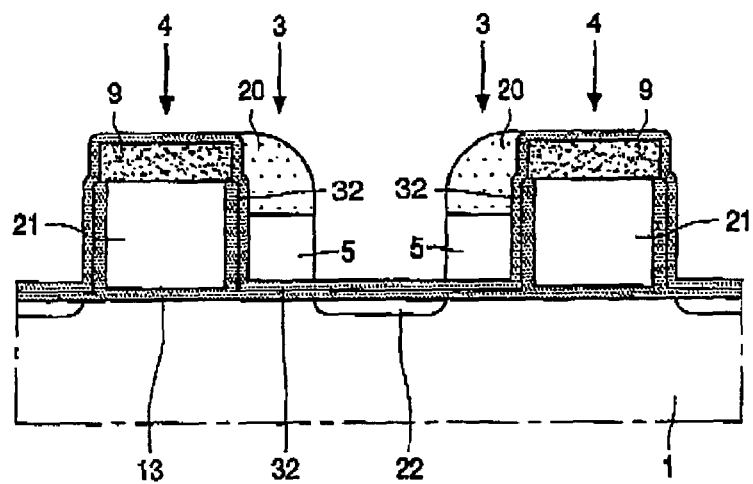

As shown in FIG. 17, the gate structure 4 is provided with an about 30 nm thick insulating layer 12 on its side walls 10 and 11, here by thermal oxidation. At the same time, in the same process step, next to this structure 4 an about 6 nm thick silicon oxide layer is formed. Some steps later, as shown in FIG. 18, the conductive layer 14 is deposited. This layer 14 is, as shown in FIG. 19, planarized, the etch mask 16 is formed, the planarized conductive layer is etched back until layer 18 is formed and spacers 20 are formed on the exposed portions 17 of said first side walls 10 of the first gate structures 4. Then, as shown in FIG. 20, the etched back conductive layer 18 is etched using the spacer 20 as a mask so as to form the control gate 5 of the gate structure 3 with the control gate 5 and the charge storage region situated between the control gate and the semiconductor body.

This method gives the opportunity of realizing a lot of gate structures 4 with control gate 5 and charge storage region between that control gate and the semiconductor body.

Figure 21:
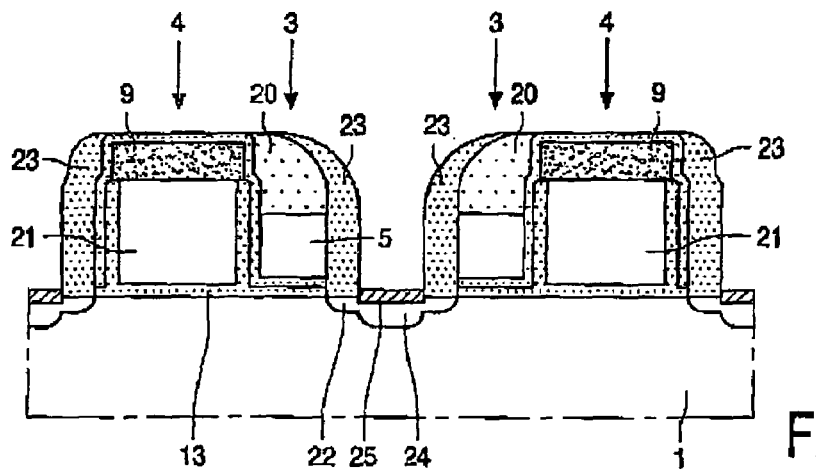

In this example the charge storage region between the control gate 5 and the semiconductor body 1 is formed by a layer 32 consisting of a silicon nitride which is deposited on the gate structure 4 before the conductive layer 14 is deposited and the silicon oxide layer 13. After the control gate 5 has been is formed, as shown in FIG. 20, the lightly doped source and drain zones 22 are formed, the spacer 23 is formed. Then, as shown in FIG. 21, the layer 32 as well as the layer of silicon oxide 13 formed on the surface 2 of the semiconductor body 1 are etched using the spacer 23 as a mask, the highly doped source- and drain zones 24 and suicide regions 25 are formed. Using the described method this memory cell can be made easily.

In the next two preferred embodiments of the manufacturing of memory cells, as shown in FIGS. 22 to 33, the gate structures 4 with to access gates 21 on gate oxide 13 are formed, the side walls 10 and 11 of these gate structures 4 are covered with an insulating layer 12 and to semiconductor body 1 next to the gate structures 4 with tunnel dielectric layer 7. Then and floating gate 6 on a tunnel dielectric 7 and covered with an inter gate dielectric 39 is formed next to the first side walls 10 of this gate structures 4, this floating gate 6 having a top surface lower than the gate structure 4 with the access gate 21, after which the conductive layer 14 is deposited and planarized, the etch mask 16 is formed, the planarized conductive layer is etched back until layer 18 has been formed. Then the spacer 21 is formed on the exposed portion of said first side walls 10 of the first gate structures 4 and the etched back conductive layer 18 is etched using to spacers 20 as a mask so as to form the control gate 5 on the inter gate dielectric 39. This method offers the opportunity of realizing a number of simple memory cells.

Figure 22:
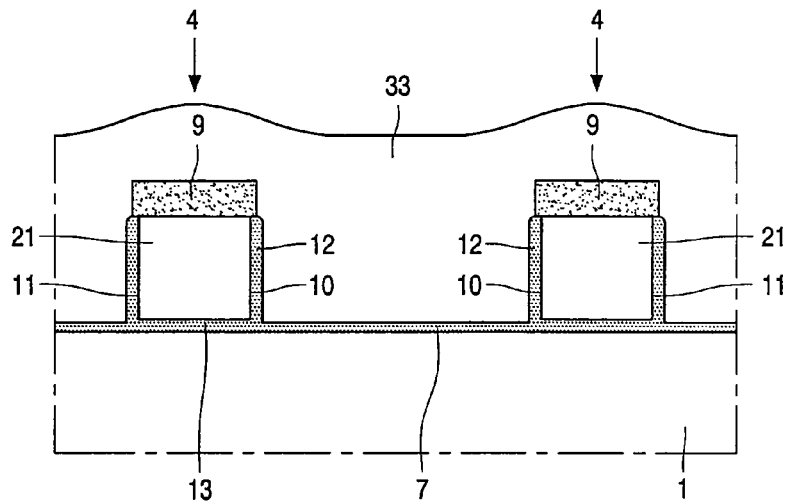
Figure 23:
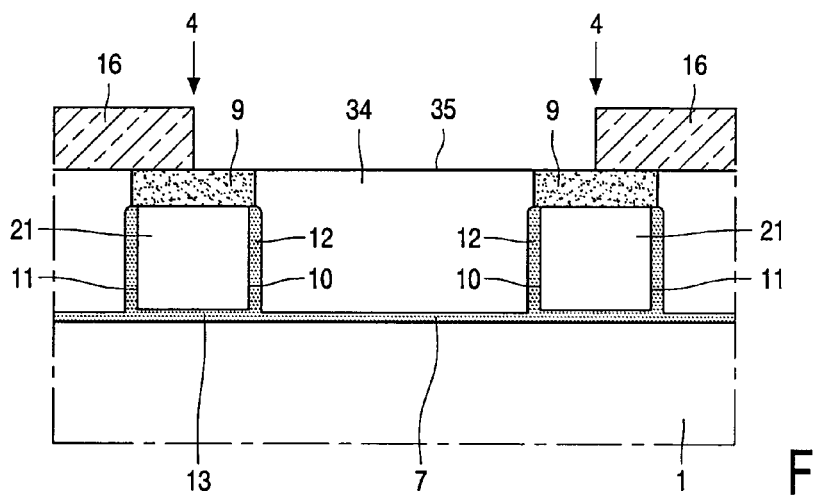
Figure 24:
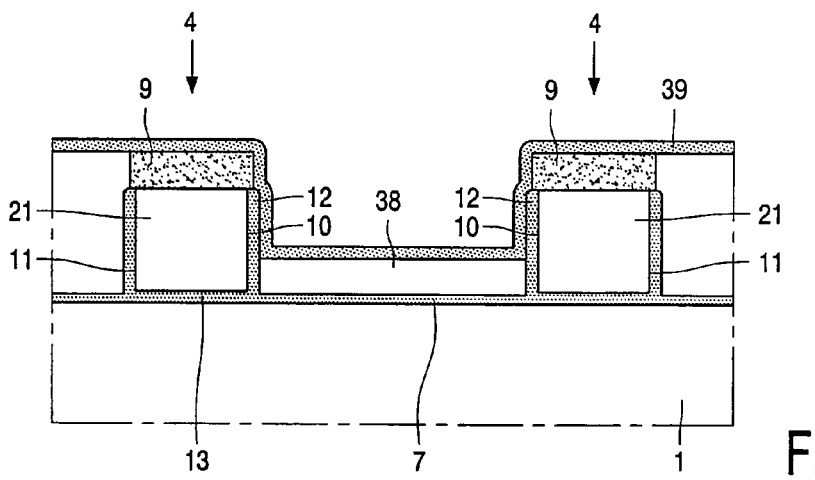
Figure 25:
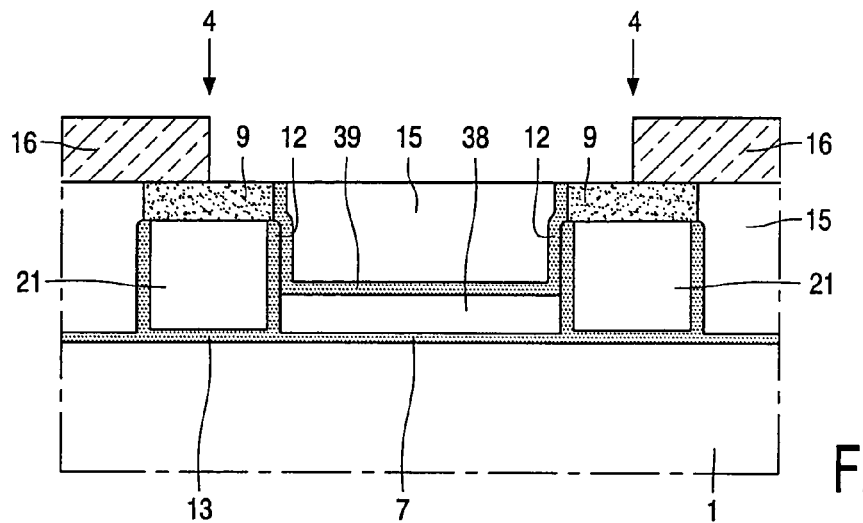
Figure 26:
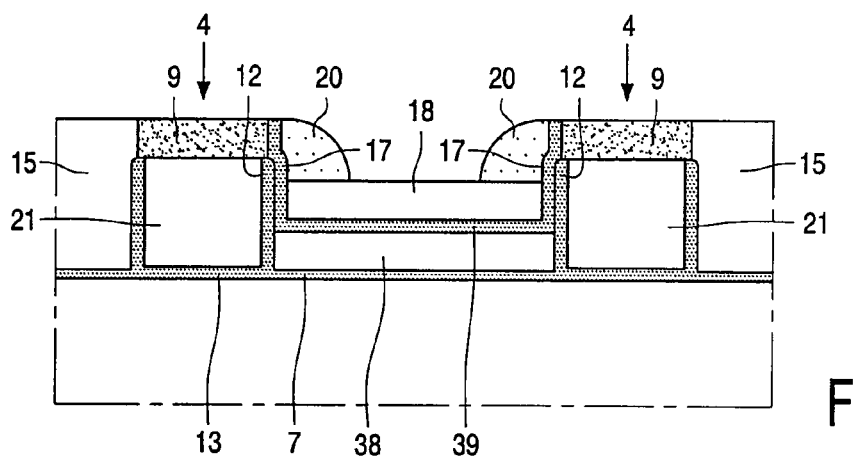

The first example is described with reference to FIGS. 22 to 27. As shown in FIG. 22 the gate structures 4 are covered with a further layer 33 of conductive material, here an about 600 nm thick layer of polycrystalline silicon. As shown in FIG. 23 this further conductive layer 33 is planarized until top layer 9 is exposed. Because the further layer has a thickness larger than that of the gate structure 4 the planarized further conductive layer 34 has a flat surface 35. Then as shown in FIG. 23 an auxiliary mask 16 is formed on the first gate structures 4 and the planarized further conductive layer 34 leaving the planarized further conductive layer 34 next to the first sides 10 of the gate structures 4 uncovered, the further conductive layer 34 is etched back to expose an upper portion of said first side walls 10. The remaining part 38 of the further conductive layer the has a thickness of about 100 nm. Then the etched back further conductive layer 38 is covered with a layer of an inter gate dielectric 39. Then the method as used in the examples described before is carried out. Thus the conductive layer 14 is deposited, planarized to conductive layer 15, the etch mask 16 is formed and the planarized conductive layer 15 is etched back until the conductive layer 18 is formed. Then the spacer 20 is formed on the exposed portion 17 of said first side walls 10 of the first gate structures 4 and the etched back conductive layer 18 and the conductive layer 38 are etched using the spacer 20 as a mask so as to form the control gate 5 in the etched back conductive layer 18 as well as the floating gate 6 in the etched back further conductive layer 38.

After the control gate 5 has been is formed, the lightly doped source- and drain zones 22 are formed. Then the spacers 23 are formed and, as shown in FIG. 27, the highly doped source- and drain zones 24 and silicide regions 25 are formed.

Figure 27:
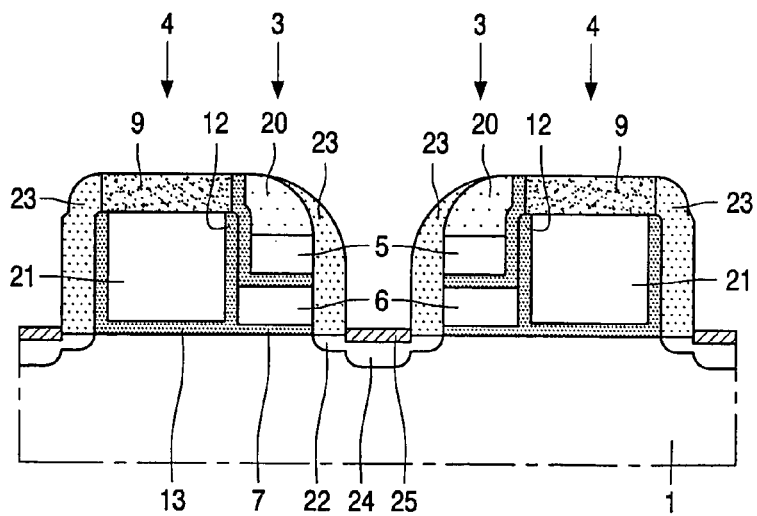

As can be seen in the FIG. 27 the inter gate dielectric 39 is present between the access gate 21 and the control gate 5 so that the electric coupling between these gates is relatively small.

The second example is described with reference to FIGS. 28 to 33. In the memory cell made using this method the electric coupling between the control gate 5 and access gate 21 is also small and further the floating gate 6 is fully surrounded by the control gate 5 so that the electric coupling between the control gate 5 and the floating gate 6 is relatively large.

Figure 28:
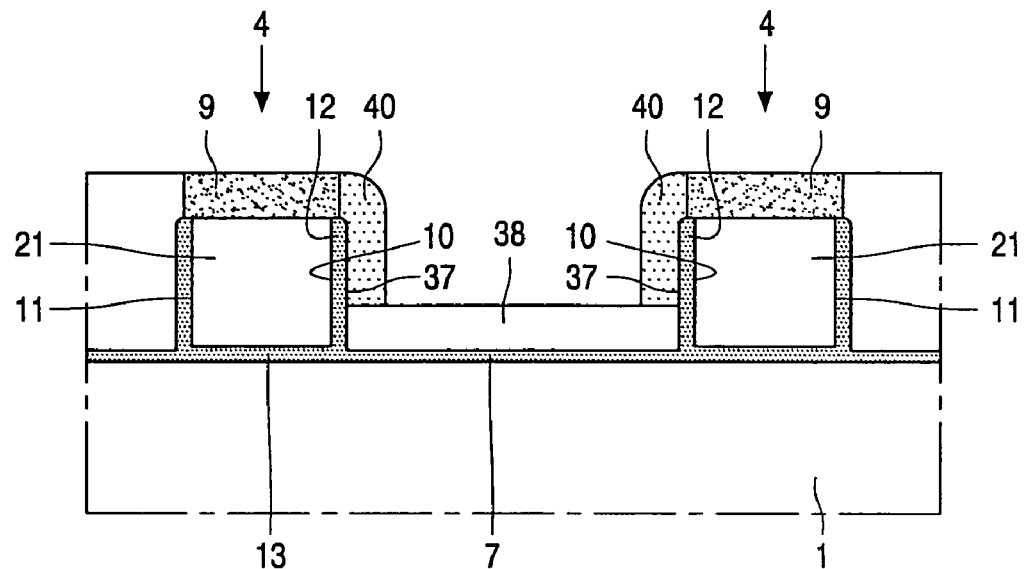
Figure 29:
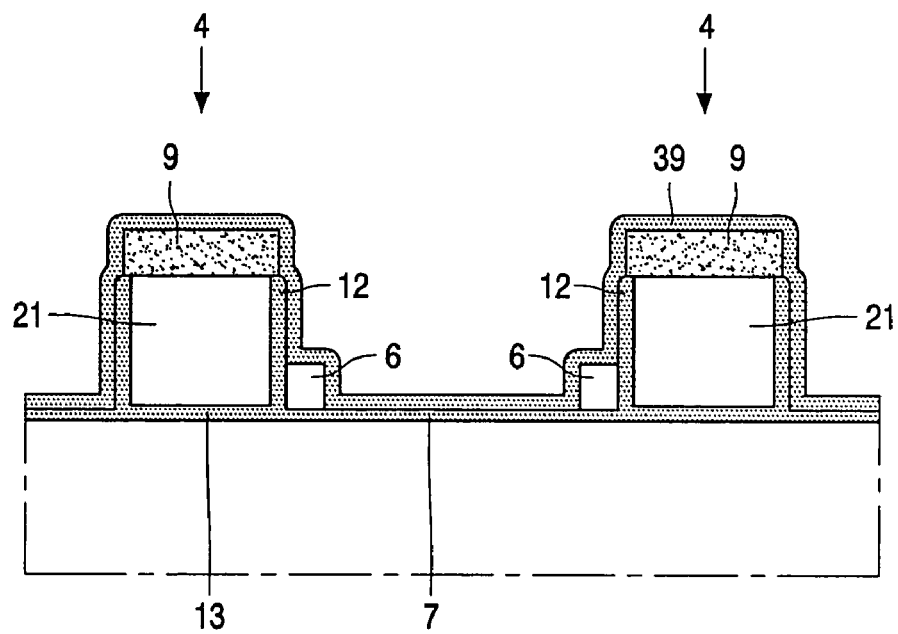
Figure 30:
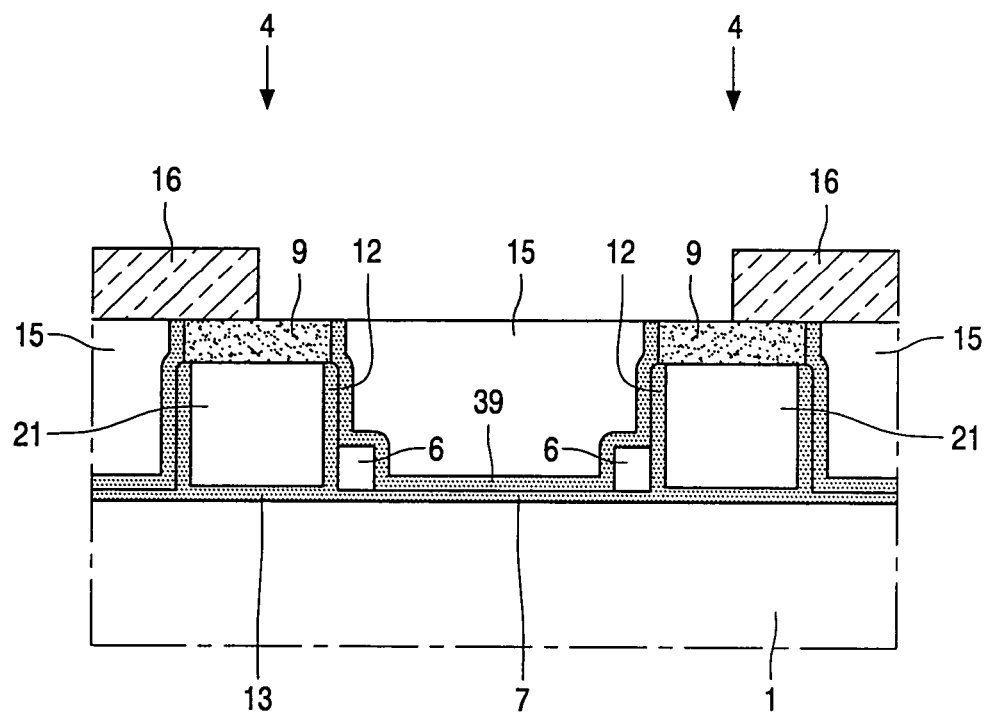
Figure 31:
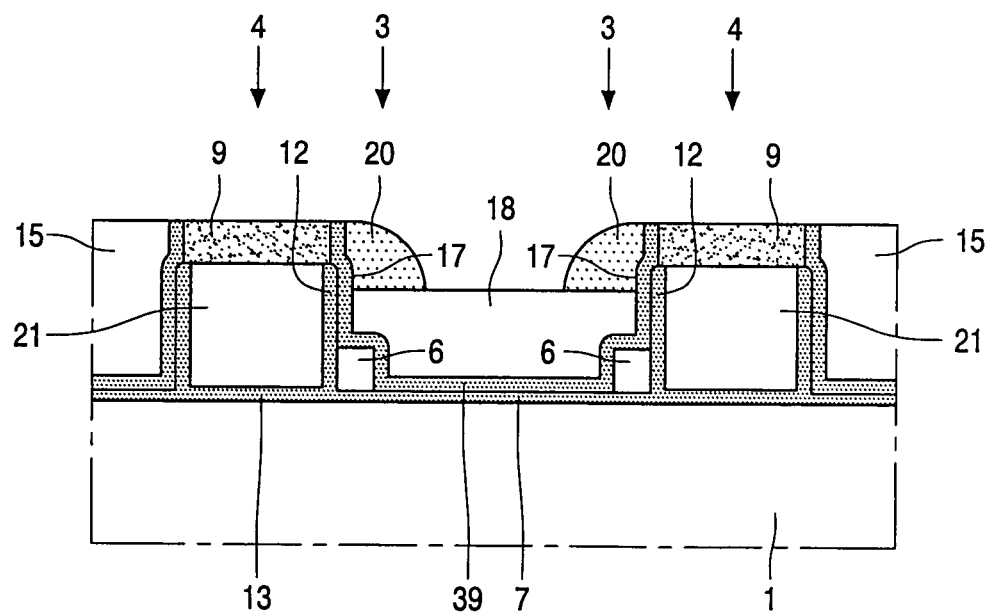

This manufacture of the second example starts with the structure as shown in FIG. 28 (see also FIGS. 22–24) where next to the gate structures 4 comprising the access gates 21 the about 100 nm thick further conductive layer 38 has been formed. Then, as shown in FIG. 28, a further spacer 40 is formed and the conductive layer 38 is etched so as to form the floating gates 6 on the tunnel dielectric layer 7 next to the gate structures 4 with the access gate 21. After removal of the further spacer 40, the tunnel dielectric layer 7 can be next to the floating gate 6 can be removed and the so formed floating gate 6 is provided with a layer of an inter gate dielectric 39. Then the method as used in the examples described before is carried out. Thus the conductive layer 14 is deposited, planarized to conductive layer 15, the etch mask 16 is formed and the planarized conductive layer 15 is etched back until the conductive layer 18 is formed. Then the spacer 20 is formed on the exposed portion 17 of said first side walls 10 of the first gate structures 4 and the etched back conductive layer 18 and the conductive layer 38 are etched using the spacer 20 as a mask so as to form the control gate 5 in the etched back conductive layer 18 on the floating gate 6.

Figure 33:
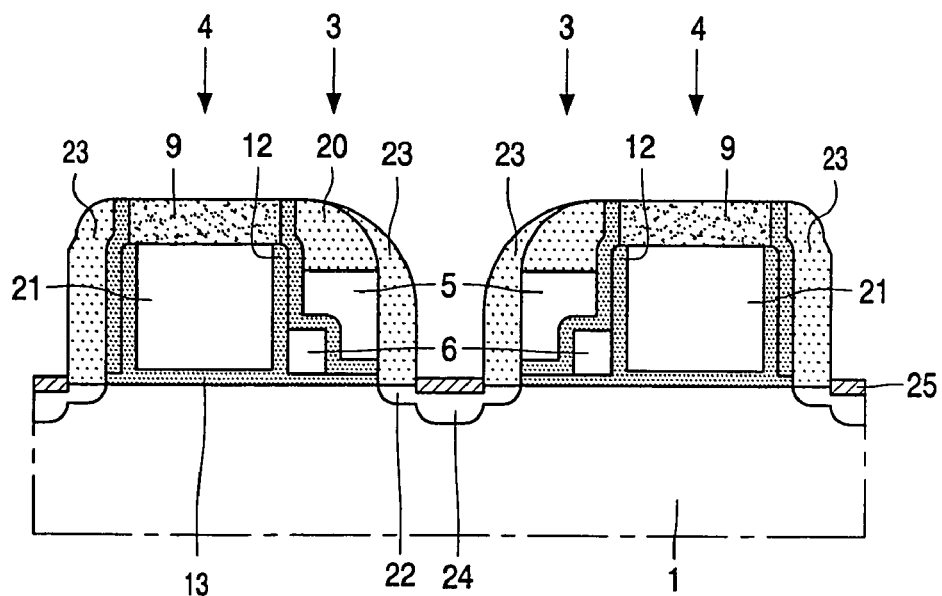

After the control gates 5 have been formed, the lightly doped source- and drain zones 22 are formed. Then the spacers 23 are formed and, as shown in FIG. 33, the highly doped source- and drain zones 24 and silicide regions 25 are formed.

The further spacer 40 has a width smaller than the width of the spacer 20 so that the floating gate 6 is fully surrounded by the control gate 5. The electrical coupling between both gates then is optimal. Such a small spacer could also be made by depositing an conductive layer followed by an anisotropic etch whereby a small conductive spacer would be left next to the gate structure 4. The method described before however is more reliable.

Figure 32:
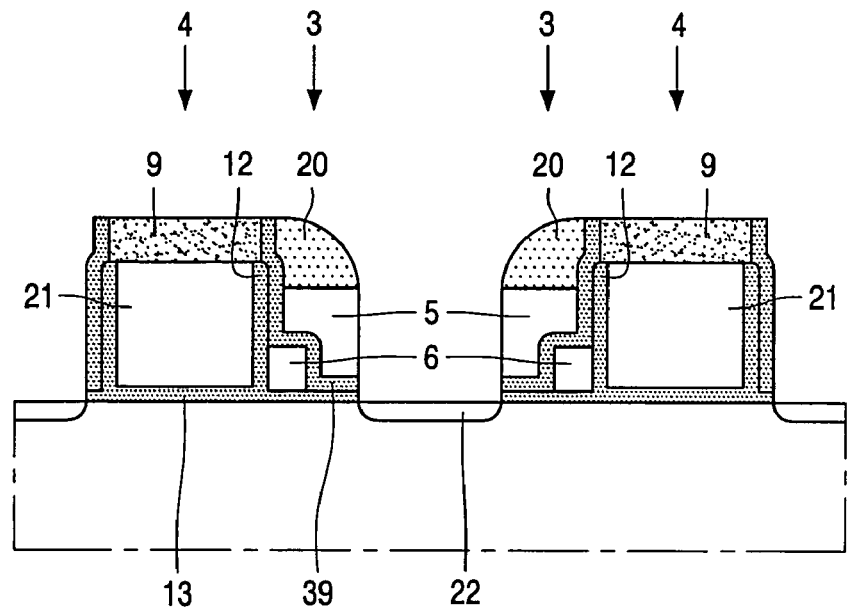

It will be clear that the spacers 20 after patterning the conductive layer 18 may be removed from the upper portions of the second one of the gate structures; the upper portions form the access gate 21 in FIGS. 9 and 15 or the control gate 5 in the FIGS. 20, 27 and 32. The gates thus exposed after patterning the conductive layer 18 then can be provided with a silicide top layer as shown in FIG. 12. The same of course is applicable for the top layer 9 formed on the first one of the gate structures.

Preferably the spacer 20 then is formed as shown in FIGS. 10 and 11 in a relatively thin first 26 and a relatively thick second layer 27. During an anisotropic etch both layers are etched until the top of the first one of the gate structures is exposed. The first and second layer are chosen so the second relatively thick layer can be etched selectively with respect to the relatively thin first layer. When the second relatively thick layer 27 is a layer of the same material as the material of the conductive layer 14 the relatively thick part of the spacer 20 is removed in the same etching process in which the conductive layer 18 is patterned. The thin layer part 26 under the spacer 20 then is used as the mask.

What is claimed is:

1. Method of manufacturing a semiconductor device comprising a semiconductor body which is provided at a surface with a non-volatile memory comprising a memory cell with a gate structure with an access gate and a gate structure with a control gate and a charge storage region situated between the control gate and the semiconductor body, in which method on the surface of the semiconductor body a first one of said gate structures is formed with side walls extending substantially perpendicular to the surface, a conductive layer is deposited on and next to said first gate-structure, the conductive layer is subjected to a planarizing treatment until the first gate structure is exposed and the so planarized conductive layer is patterned so as to form at least a part of the other gate structure adjoining only a first one of the side walls of the first gate structure, characterized in that, to perform said patterning of the planarized conductive layer, an etch mask is formed on the first gate structure and the planarized conductive layer which etch mask leaves the planarized conductive layer next to said first side wall uncovered and covers the planarized conductive layer next to the side wall opposite to the first side wall, after which the planarized conductive layer is etched back so as to expose an upper portion of said first side wall, the etch mask is removed, a spacer is formed on the exposed upper portion of said first side wall and the conductive layer is etched anisotropically using the spacer as a mask, whereby the conductive layer next to the spacer and next to the side wall of the first gate structure opposite to said first side wall is removed.

2. Method as claimed in claim 1, characterized in that, as the first one of said gate structures the gate structure with the control gate and the charge storage region situated between the control gate and the semiconductor body is formed, the side walls of this gaze structure are covered by an insulating layer and the surface of the semiconductor body next to the gate structure is provided with a gate dielectric, after which the conductive layer is deposited and planarized, the etch mask is formed, the planarized conductive layer is etched back, the spacer is formed on the exposed portion of said first side wall of the first gate structure and the etched back conductive layer is etched using the spacer as a mask so as to form the gate structure with the access gate adjoining said first side wall.

3. Method as claimed in claim 1, characterized in that, as the first one of said gate structures the gate structure with the access gate is formed, after which the side walls of this gate structure are covered by an insulating layer, the conductive layer is deposited and planarized, the etch mask is fanned, the planarized conductive layer is etched back, the spacer is formed on the exposed portion of said first side wall of the first gate structure and the etched back conductive layer is etched using the spacer as a mask so as to form the control gate of the gate structure with the control gate and the charge storage region situated between the control gate and the semiconductor body.

4. Method as claimed in claim 3, characterized in that, after the gate structure with the access gate is formed and the side walls of this gate structure are covered with an insulating layer, a charge storage region is formed next to the gate structure in the form of a collection of mutually separated trapping centers, after which the conductive layer is deposited and planarized, the etch mask is formed, the planarized conductive layer etched back, the spacer is formed on the exposed portion of said first side wall of the first gate structure and the etched back conductive layer is etched using the spacer as a mask so as to form the control gate on the charge storage region.

5. Method as claimed in claim 3, characterized in that, after the gate structure with the access gate is formed and the side walls, of this gate structure are covered with an insulating layer, a floating gate on a tunnel dielectric and covered with an inter gate dielectric is formed next to the first side wall of this gate structure, this floating gate having a top surface lower than the gate structure with the access gate, after which the conductive layer is deposited and planarized, the etch mask is formed, the planarized conductive layer is etched back, the spacer is formed on the exposed portion of said first side wall of the first gate structure and the etched back conductive layer is etched using the spacer as a mask so as to form the control gate on the inter gate dielectric.

6. Method as claimed in claim 5, characterized in that, for forming the floating gate on the tunnel dielectric next to the first side of the gate structure with the access gate, a further conductive layer is deposited and planarized until the gate structure with the access gate is exposed, after which an auxiliary mask is formed on the first gate structure and the planarized further conductive layer leaving the planarized further conductive layer next to the first side of the gate structure uncovered, the further conductive layer is etched back to expose an upper portion of said first side wall, after which the etched back further conductive layer is covered with a layer of an inter gate dielectric, the conductive layer is deposited, planarized, the etch mask is formed and the planarized conductive layer is etched back, the spacer is formed on the exposed portion of said first side wall of the first gate structure and the etched back conductive layer is etched using the spacer as a mask so as to form the control gate in the conductive layer as well as the floating gate in the etched back further conductive layer.

7. Method as claimed in claim 5, characterized in that, for forming the floating gate on the tunnel dielectric next to the first side of the gate structure with the access gate, a further layer of conductive material is deposited, planarized until the gate structure with the access gate is exposed, after which an auxiliary mask is formed on the first gate structure and the planarized further conductive layer leaving the planarized further conductive layer next to the first side of the gate structure uncovered, the further conductive layer is etched back to expose an upper portion of said first side wall, after which a further spacer is formed on the exposed upper portion of said other first side wall and the etched back further conductive layer is etched using the further spacer as a mask, after which the further spacer is removed and the so formed floating gate is provided with a layer of an inter gate dielectric, the conductive layer is deposited and planarized, the etch mask is formed and the planarized conductive layer is etched back, the spacer is formed on the exposed portion of said first side wall of the first gate structure and the etched back conductive layer is etched using the spacer as a mask so as to form the control gate on the floating gate.

8. Method as claimed in claim 1, characterized in that, before the deposition of the conductive layer on top of the first one of said gate structures an insulating layer is formed which may act as a stop layer during the planarization of he conductive layer.

9. Method as claimed in claim 1, characterized in that, after patterning the conductive layer the spacer on the upper portions of the first one of the gate structures is removed.

10. Method as claimed in claim 9, characterized in that for forming the spacer a relatively thin first and a relatively thick second layer are deposited, after which an etch is performed whereby both layers are etched until the top of the first one of the gate structures is exposed, whereby the first and second layers are chosen so that the second relatively thick layer can be etched selectively with respect to the relatively thin first layer.

11. Method as claimed in claim 10, characterized in that the second relatively thick layer is a layer of the same material as the material of the conductive layer.

* * * * *